United States Patent
Iida et al.

(10) Patent No.: US 6,197,109 B1
(45) Date of Patent: Mar. 6, 2001

(54) METHOD FOR PRODUCING LOW DEFECT SILICON SINGLE CRYSTAL DOPED WITH NITROGEN

(75) Inventors: Makoto Iida; Masaro Tamatsuka; Wataru Kusaki; Masanori Kimura; Shozo Muraoka, all of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/329,615

(22) Filed: Jun. 10, 1999

(30) Foreign Application Priority Data

Jun. 18, 1998 (JP) .................................................. 10-188227

(51) Int. Cl.$^7$ .................................................. C30B 15/04
(52) U.S. Cl. .................................. 117/19; 117/13; 117/20
(58) Field of Search .................................. 117/13, 19, 20

(56) References Cited

FOREIGN PATENT DOCUMENTS

| 0 170 788 | 2/1986 | (EP) . | |
|---|---|---|---|
| 0 391 709 | 10/1990 | (EP) . | |
| 0 829 559 | 3/1998 | (EP) . | |
| 60-251190 | 12/1985 | (JP) | ........................ C30B/15/04 |
| 4-192345 | 7/1992 | (JP) | ........................ H01L/21/66 |
| 5-294780 | 11/1993 | (JP) . | |

OTHER PUBLICATIONS

Maddalon–Vinante, et al. "Influence of Rapid Thermal Annealing and Internal Gettering on Czochralski–grown silicon. I. Oxygen precipitation," J. Appl. Phys. 79(5), Mar. 1, 1996, pp. 2707–2711.

Shimura, et al. "Nitrogen effect on oxygen precipitation in Czochralski silicon," 320 Applied Physics Letter 48 (1986) Jan., No. 3, pp. 223–225.

Voronkov, V.V. "The Mechanism of Swirl Defects Formation in Silicon," Journal of Crystal Growth 59 (1982) pp. 625–643.

Von Ammon, et al. "The Dependence of Bulk Defects on the Axial Temperature Gradient of Silicon Crystals dueing Czochralski Growth," 2300 Journal of Crystal Growth 151 (1995) Jun. 1, Nos.3,4, pp. 273–277.

Dornberger, et al. "Influence of Boron Concentration on the Oxidation–induced Stacking Fault Ringin Czochralski Silicon Crystals," Journal of Crystal Growth 180 (1997), pp. 343–352.

Abe, Takao and Hiroshi Takeno, "Dynamic Behavior of Intrinsic Point Defects in FZ and CZ Silicon Crystals," Mat. Res. Soc. Symp. Proc. vol. 262, 1992 Materials Research Society, pp. 3–13.

V.V. Voronkov, "The Mechanism of Swirl Defects Formation in Silicon," Journal of Crystal Growth 59 (1982), pp. 625–643.

Sadamitsu, et al., "Dependence of the Grown–in Defect Distribution on Growth Rates in Czochralski Silicon," Jpn. J. Appl. Phys. vol. 32 (1993), pp. 3675–3681.

*Primary Examiner*—Felisa Hiteshew
(74) *Attorney, Agent, or Firm*—Hogan & Hartson, LLP.

(57) ABSTRACT

There is disclosed a method for producing a silicon single crystal by growing the silicon single crystal by the Czochralski method, characterized in that the crystal is pulled at a pulling rate [mm/min] within a range of from V1 to V1+0.062×G while the crystal is doped with nitrogen during the growing, where G [K/mm] represents an average temperature gradient along the crystal growing direction, which is for a temperature range of from the melting point of silicon to 1400° C., and provided in an apparatus used for the crystal growing, and V1 [mm/min] represents a pulling rate at which an OSF ring disappears at the center of the crystal when the crystal is pulled by gradually decreasing the pulling rate. The method of the present invention can produce silicon single crystal wafers exhibiting an extremely low defect density over the entire plane of the crystal, in particular, with no small pits, and having an excellent oxide dielectric breakdown voltage, based on the CZ method under widely and easily controllable production conditions at a high production rate and high productivity.

8 Claims, 3 Drawing Sheets

METHOD FOR PRODUCING LOW DEFECT SILICON SINGLE CRYSTAL DOPED WITH NITROGEN

BACKGROUND OF THE INVENTION

1. Field of the Invention

The present invention relates to a silicon single crystal wafer with few crystal defects and a method for producing the same.

2. Description of Related Art

In recent years, with the use of finer semiconductor devices required for higher integration degree of semiconductor devices such as DRAM, increasingly higher quality of silicon single crystals produced by the Czochralski method (abbreviated as CZ method hereinafter) and used for substrates of the devices has been desired. In particular, such crystals are likely to contain defects introduced during the crystal growth, which are called grown-in defects such as FPD, LSTD and COP, and degrade the oxide dielectric breakdown voltage and other device characteristics, and it is considered important to reduce the density and the size of the defects.

For the reference of the explanation of those defects, there will be given first general knowledge of factors determining densities of defects introduced in silicon single crystals, a void type point defect called vacancy (occasionally abbreviated as V hereinafter), and an interstitial type silicon point defect called interstitial silicon (occasionally abbreviated as I hereinafter).

A V-region in a silicon single crystal means a region containing many vacancies, i.e., depressions, pits, voids and the like generated due to missing of silicon atoms, and an I-region means a region containing many dislocations and aggregations of excessive silicon atoms generated due to excessive amount of silicon atoms. Between the V-region and the I-region, there should be a neutral (occasionally abbreviated as N hereinafter) region with no (or little) shortage or no (or little) surplus of the atoms. It has become clear that the aforementioned grown-in defects (FPD, LSTD, COP etc.) should be generated strictly only with supersaturated V or I, and they would not be present as defects even though there is little ununiformity of atoms so long as V or I is not saturated.

The densities of these two kinds of defects are determined by the relationship between the crystal pulling rate (growing rate) V, and the temperature gradient G in the vicinity of the solid-liquid interface in the crystal in the CZ method. It has been confirmed that defects distributed in a ring shape called OSF (Oxidation Induced Stacking Fault) are present around the boundary between the V-region and the I-region.

Those defects generated during the crystal growth include those mentioned below. For example, when the growth rate is relatively high, i.e., around 0.6 mm/min or higher, grown-in defects considered to be originated from voids, i.e., aggregations of void-type defects, such as FPD, LSTD, and COP are distributed over the entire cross-section of the crystal along the radial direction at a high density, and a region containing such defects is called V-rich region. When the growth rate is 0.6 mm/min or lower, the aforementioned OSF ring is initially generated at the circumferential part of the crystal with the decrease of the growth rate, and L/D (large dislocations, which include LSEPD, LFPD and the like, and are also called interstitial dislocation loops or dislocation clusters), which are considered to be originated from dislocation loops, are present outside the ring at a low density, and a region containing such defects is called. I-rich region. When the growth rate is further lowered to around 0.4 mm/min or lower, the OSF ring shrinks at the center of wafer and disappears, and thus the entire plane becomes the I-rich region.

Recently, there has been discovered a region called N-region containing neither the void-originated FPD, LSTD, and COP, nor the dislocation loop-originated LSEPD and LFPD, which region is present between the V-rich region and the I-rich region, and outside the OSF ring. This region exists outside the OSF ring, and shows substantially no oxygen precipitation occurred when subjected to a heat treatment for oxygen precipitation and examined by X-ray analysis or the like as for the precipitation contrast. This region is present at rather I-rich side, and the defects are not so rich as to form dislocation clusters such as LSEPD and LFPD.

Because this N-region is obliquely formed with respect to the growing axis when the growth rate is lowered in a conventional growing method, it exists as only a part of the wafer plane.

With respect to the defects mentioned above, according to the Voronkov's theory (V. V. Voronkov, Journal of Crystal Growth, 59 (1982) 625–643), it was proposed that a parameter of V/G, which is a ratio of the pulling rate (V) and the crystal solid-liquid interface temperature gradient (G) along the growing axis, determined the type and the total density of the point defect. In view of this, because the pulling rate should be constant in a plane, for example, a crystal having a V-rich region at the center, I-rich region at the periphery, and N-region therebetween is inevitably obtained at a certain pulling rate due to the ununiformity of the gradient G in the plane.

Therefore, improvement of such ununiformity of the gradient G has recently been attempted, and it has become possible to produce a crystal-having the N-region spreading over an entire transverse cross-section of the crystal (this region can previously exist only obliquely), for example, when the crystal is pulled with a gradually decreasing pulling rate V. Further, such an N-region spreading over an entire transverse cross-section can be made larger to some extent along the longitudinal direction of the crystal by pulling the crystal at a pulling rate maintained at a value at which the N-region transversely spreads. Furthermore, it has also become possible to make the N-region spreading over the entire transverse cross-section somewhat larger along the growing direction by controlling the pulling rate together with correction of G with reference to its variation with the crystal growth, so that the V/G should strictly be maintained constant. This N-region spreading over the entire transverse cross-section does not contain grown-in defects at all, and exhibits good oxide dielectric breakdown voltage.

Other than the aforementioned techniques, the gradual cooling method can be mentioned as a currently used method for reducing the defects. In this method, a crystal having a region containing excessive voids, called V-rich region, over the entire cross-section is pulled at a relatively high pulling rate, and the time for passing the crystal through a temperature range of 1150°–1080° C. during the pulling of crystal is prolonged to decrease the defect density. This method can improve the oxide dielectric breakdown voltage.

There has also been a method for pulling a crystal wherein the crystal is pulled at a low pulling rate so that the crystal should have a region containing excessive interstitial silicon, a region called I-rich region. This method substantially eliminates COP and the like, and affords good oxide dielectric breakdown voltage.

Further, V-rich crystals has been conventionally doped with nitrogen to afford crystals with extremely few FPD and COP.

When it is desired to use a higher pulling rate in the production of a crystal having an extremely low defect region such as one having the N-region over the entire transverse cross-section, the solid-liquid interface temperature gradient G of the crystal along the growing axis direction can be made larger based on the Voronkov's theory. However, the gradient G also must be made uniform with respect to the transverse direction of the crystal, and therefore such increase of the pulling rate is restricted by the limitation concerning the internal structure of furnace (hot zone, HZ) provided in an apparatus for crystal growing. In addition, in order to obtain the N-region, the pulling rate must be controlled within a narrow range, and therefore it is difficult to make the N-region larger along the crystal growth direction. Thus, such attempts do not suit the large scale production.

Further, the aforementioned gradual cooling method performed as to the V-rich region has been proven to make the defect size larger even though it may reduce the defect density, and therefore it cannot be an ultimate solution.

Moreover, it has also known that the I-rich crystal contains large dislocation loops (dislocation clusters), and electric current leaks through these dislocations in devices, which leads to dysfunction of P-N junction. Furthermore, when compared at the same oxygen concentration, oxygen precipitation is more unlikely to be generated in the I-rich crystal compared with the V-rich crystal, and therefore its gettering ability is not sufficient.

As to a nitrogen-doped crystal produced by the conventional CZ method (mostly composed of the V-rich crystal), grown-in defects are not apparently observed. However, precise examination of such a crystal has revealed that nitrogen had only an effect for suppressing the aggregation of the defects, and hence such a crystal contained a lot of small defects (occasionally referred to as small pits hereinafter) at a high density. Further, measured oxide dielectric breakdown voltage of such a crystal is not so good.

SUMMARY OF THE INVENTION

The present invention has been accomplished in view of the aforementioned problems, and its object is to obtain a silicon single crystal wafer exhibiting an extremely low defect density over the entire plane of the crystal, in particular, with no small pits, and having an excellent oxide dielectric breakdown voltage, based on the CZ method under widely and easily controllable production conditions at a high production rate and high productivity.

The present invention has been accomplished in order to achieve the aforementioned object, and provides a method for producing a silicon single crystal by growing the silicon single crystal by the Czochralski method, characterized in that the crystal is pulled at a pulling rate [mm/min] within a range of from V1 to V1+0.062×G while the crystal is doped with nitrogen during the growing, where G [K/mm] represents an average temperature gradient along the crystal growing direction, which is for a temperature range of from the melting point of silicon to 1400° C., and provided in an apparatus used for the crystal growing, and V1 [mm/min] represents a pulling rate at which an OSF ring disappears at the center of the crystal when the crystal is pulled by gradually decreasing the pulling rate.

The pulling rate V1, at which the OSF ring disappears at the center of crystal, is preliminarily determined from a defect distribution diagram of crystal not doped with nitrogen such as shown in FIG. 1, which is obtained through analysis of results of experiments and studies. Separately, another pulling rate V2, at which the small pits disappear from a crystal doped with nitrogen, is determined from a defect distribution diagram obtained for a crystal doped with nitrogen. By pulling a crystal at a pulling rate within the range of from V1 to V2 while it is doped with nitrogen, a silicon single crystal whose small pits are eliminated from its entire transverse cross-section can be pulled under widely and easily controllable conditions at a relatively high pulling rate, and hence such a silicon single crystal can be produced with high productivity. In this case, a coefficient 0.062 mm$^2$/K·min, which determines the difference of V1 and V2, i.e., ΔV, according to the equation of ΔV=0.062×G, corresponds to the difference of the parameters V1/G and V2/G, which are determined by the internal structure of a furnace of growing apparatus to be used, and are considered to determine the density of point defects. Therefore, by calculating the range of the pulling rate from those values and G, the method can be adapted to any kind of internal structure of the furnace (G).

In the aforementioned method, nitrogen is preferably doped at a concentration of 1×10$^{14}$ atoms/cm$^3$ or more.

The above characteristic is defined, because the concentration of 1×10$^{14}$ atoms/cm$^3$ or more of the doped nitrogen is preferred in order to effectively suppress the formation of small pits in the crystal plane and eliminate them.

The present invention also provides a method for producing a silicon single crystal wafer, characterized in that the method comprises subjecting a wafer obtained from a silicon single crystal produced by the aforementioned method to a heat treatment to out-diffuse nitrogen in a surface layer of the wafer.

According to the aforementioned method, nitrogen is eliminated from the wafer surface layer, and thus unusual oxygen precipitation in the surface layer due to nitrogen contained therein can be prevented. Further, because the bulk portion of the wafer will contain nitrogen, oxygen precipitation therein is promoted, and thus a wafer with sufficient intrinsic gettering effect (IG effect) can be produced.

In the aforementioned method, the heat treatment is preferably performed by a rapid thermal annealer (occasionally referred to as RTA apparatus hereinafter). This apparatus is an automatic continuous heat treatment apparatus for single wafer processing, and it can perform heating and cooling before and after the heat treatment within several seconds to several hundreds of seconds. Therefore, it can effectively out-diffuse nitrogen in the surface layer with a heat treatment in a short period of time such as several seconds to several hundreds of seconds without subjecting a wafer to long thermal history, which is likely to be accompanied by disadvantages.

The present invention also provides a silicon single crystal wafer, characterized in that the wafer is obtained from a silicon single crystal produced by the aforementioned method for producing a silicon single crystal. This silicon wafer of the present invention is an extremely low defect silicon single crystal wafer doped with a desired amount of nitrogen, whose small pits are eliminated over the entire crystal plane. This wafer would become a wafer of the V-rich region, if it were grown in a conventional manner.

According to the present invention, by pulling a silicon single crystal at a pulling rate within the range of from V1 to V1+0.062×G, while the crystal is doped with nitrogen during the growing, a small pit free crystal can be grown, which would otherwise be composed of the V-rich region. Therefore, extremely low defect crystals with excellent oxide dielectric breakdown voltage can stably be produced with high productivity and high yield. Further, by subjecting a wafer obtained from the crystal to a heat treatment, nitrogen in the surface layer of the wafer is out-diffused, and oxygen precipitation sufficient for gettering is generated by nitrogen in the bulk portion of the wafer. Thus, silicon single crystal wafers with excellent oxide dielectric breakdown voltage can easily be produced with high productivity.

DESCRIPTION OF THE INVENTION AND EMBODIMENTS

Figure 1:
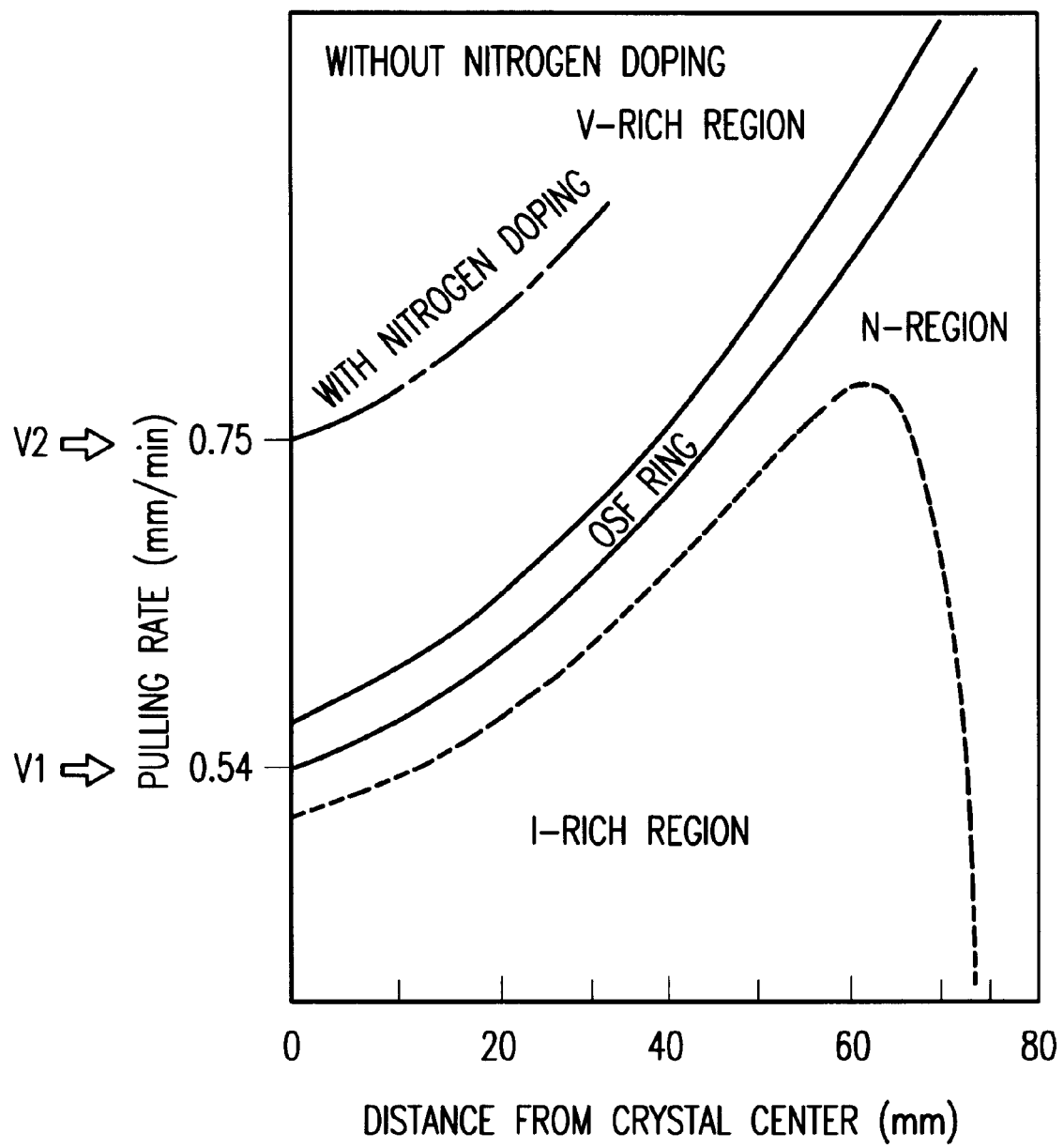
FIG. 1 is a defect distribution diagram representing distribution of various defects in a crystal obtained by a conventional pulling method and the pulling rate range according to the present invention, wherein the abscissas axis represents the location in a crystal with respect to the radial direction, and the ordinate axis represents the pulling rate.

The present invention will be explained in detail hereinafter, but the present invention is not limited by this explanation. Before the explanation, technical terms used herein are defined beforehand.

1) FPD (Flow Pattern Defect)

When a wafer sliced from a grown silicon single crystal ingot is subjected to etching with a mixture of hydrofluoric acid and nitric acid to remove a surface damaged layer, and surface etching with a mixture of $K_2Cr_2O_7$, hydrofluoric acid and water (Secco etching), pits and a ripple pattern are formed on the wafer surface. This ripple pattern is called FPD, and a higher FPD density on the wafer surface caused more frequent oxide dielectric breakdown voltage failure (see Japanese Patent Application Laid-open (KOKAI) No. 4-192345).

2) SEPD (Secco Etch Pit Defect)

As for the FPD generated after the aforementioned Secco etching, those accompanied by a flow pattern are called FPD, and those not accompanied by the flow pattern are called SEPD. Among those SEPD, large SEPD having a size of 10 $\mu$m or more (LSEPD) are considered to be originated from dislocation clusters, and electric current may leak through these dislocation clusters present in devices, which leads to dysfunction of P-N junction.

3) LSTD (Laser Scattering Tomography Defect)

After a wafer is sliced from a grown silicon single crystal ingot, and subjected to etching with a mixture of hydrofluoric acid and nitric acid to remove a surface damaged layer, the wafer is cleaved. When the cleaved surface is irradiated with an infrared light, scattered lights caused by defects present in the wafer can be observed by detecting lights emitted from the wafer surface. The light-scattering substances causing this phenomenon have already been reported in academic societies and the like, and considered to be oxide precipitates (see Jpn. J. Appl. Phys. Vol. 32, p3679, 1993). More recent study also reported that they are octahedral voids (holes).

4) COP (Crystal Originated Particle)

COP means defects causing degradation of oxide dielectric breakdown at the center of wafer, and formed after SC-1 cleaning (cleaning with a mixture of $NH_4OH:H_2O_2:H_2O=$ 1:1:10, which serves as a selective etching solution) from defects that would otherwise be FDP after the Secco etching. Pits of this kind has a diameter of 1 $\mu$m or less, and detected by the light scattering method.

5) L/D (Large Dislocation, also called interstitial dislocation loop)

Defects of this kind include LSEPD, LFPD and the like, and they are considered to be originated from dislocation loops, and also called dislocation clusters or large dislocation loops. Among these defects, LSEPD refers to large ones having a size of 10 $\mu$m or more as described above. LFPD refers large ones having an end pit size of 10 $\mu$m or more among the aforementioned FPD, and they are also considered to be dislocation clusters originated from dislocation loops.

The term "small pit" as used herein refers to such grown-in defects including FPD, LSTD, COP and the like, which are detected upon observation of a wafer after the aforementioned Secco etching.

Embodiments of the present invention will be explained in more detail hereinafter with reference to the appended drawings.

Concerning the silicon single crystal growth by the CZ method, the inventors of the present invention previously found a neutral region (N-region) containing extremely few FPD, LSTD and COP and no LSEPD in an extremely narrow region around the boundary of the V-region and the I-region thorough detailed study of the boundary as disclosed in the Japanese Patent Application No. 9-199415.

Based on the above, the inventors of the present invention considered that, if the N-region can be extended over the entire plane of wafer, the point defects may be markedly reduced. Among the growth (pulling) rate and the temperature gradient, the major factor determining the point defect density distribution should be the temperature gradient, because the pulling rate is substantially constant within a wafer plane in a crystal. That is, the inventors of the present invention found that the difference of the temperature gradient along the growing axis present within a wafer plane constitutes the point, and if this difference can be reduced, the density difference of point defects in the wafer plane can also be reduced. Therefore, they proposed a method comprising controlling the difference of the temperature gradient $\Delta G$ between the temperature gradient Gc at the crystal center and the temperature gradient Ge at the crystal periphery to be 5° C./cm or less ($\Delta G=(Ge-Gc)\leq 5°$ C./cm), and thus it became possible to obtain a wafer with no defects whose entire plane is composed of the N-region. However, in this method, because of the structural limitation of HZ, use of a higher growing rate is limited, and the controllable range becomes extremely narrow.

On the other hand, as for the effect of doping with light element impurities such as nitrogen on the grown-in defect distribution, it has already been reported that doping with boron makes the size-decreasing rate of the OSF ring slightly faster, and makes dislocation loops more unlikely to be generated. Further, it has also been pointed out that doping with nitrogen suppresses aggregation of vacancies in silicon, and reduces the density of crystal defects (T. Abe and H. Takeno, Mat. Res. Soc. Symp. Proc. Vol. 262, 3, 1992).

Therefore, the inventors of the present invention investigated planes of crystals obtained by doping with nitrogen and varying the pulling rate in a crystal pulling apparatus provided with a conventional internal structure of furnace having a large ΔG around the crystal solid-liquid interface, and obtained a novel finding explained below. The inventors of the present invention further investigated various conditions therefor, and thus completed the present invention.

That is, it has been found that, when a crystal is doped with nitrogen, critical values of the pulling rate concerning the defect distribution shift to the higher pulling rate side, and if the crystal is pulled at a pulling rate within a certain range, there would not be formed small pits, which would otherwise be potentially present at a high density in a usual crystal not doped with nitrogen.

This finding has been obtained by growing a crystal with a varying pulling rate while the crystal is doped with nitrogen during the growing, slicing wafers from the resulting single crystal ingot, and examining their grown-in defects, and subjecting the wafers to a heat treatment and examining whether an OSF ring is formed or not.

First, a usual silicon single crystal having a diameter of 6 inches was pulled without doping with nitrogen while the pulling rate was decreased. The defect distribution diagram shown in FIG. 1 was prepared based on the obtained results, wherein the abscissas axis represents the location in a crystal with respect to the radial direction, and the ordinate axis represents the pulling rate.

Figure 2:
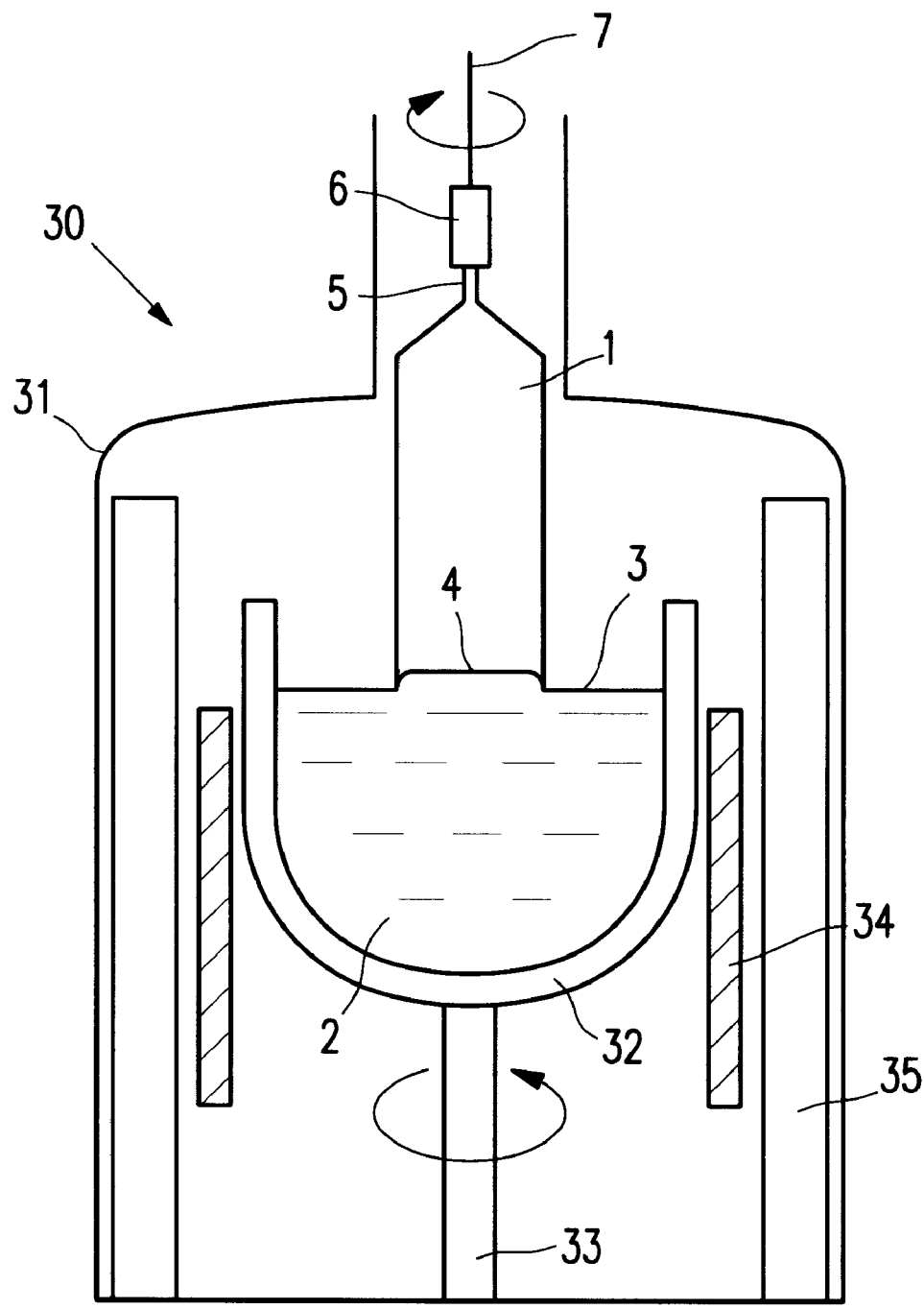
FIG. 2 is a schematic explanatory view of an apparatus for pulling a single crystal by the CZ method used for the present invention.

The apparatus used had such a structure as shown in FIG. 2. The pulling apparatus 30 was provided with a quartz crucible having a diameter of 20 inches, which was charged with 60 kg of polycrystal silicon material. A silicon single crystal ingot having a diameter of 6 inches and direction <100> was pulled while the average pulling rate was decreased from 1.20 mm/min to 0.40 mm/min (the single crystal ingot had a straight body length of about 60 cm).

The apparatus had a conventional internal structure (HZ), which provided 3.551 K/mm of an average temperature gradient G [K/mm] along the crystal growth axis between the melting point of silicon to 1400° C. The average temperature gradient G is decided by the internal structure of the furnace of the apparatus used.

From the results shown in FIG. 1, it can be seen that the OSF ring dissapeared at the center of the crystal at a pulling rate V1 of 0.54 mm/min.

Then, another crystal was pulled by a pulling apparatus having the same internal structure of the furnace as mentioned above (G=3.551 K/mm) while the average pulling rate was decreased under the same condition, but the crystal was doped with nitrogen. The concentration of the doped nitrogen was controlled to be $1 \times 10^{14}$ atoms/cm$^3$ at the shoulder of the crystal.

In this crystal doped with nitrogen, small pits were not observed at the center of the crystal at all at a pulling rate V2 of 0.75 mm/min or less (see FIG. 1). If the crystal were pulled without doping of nitrogen, the crystal would have composed of the V-rich region and contained small pits at a high density. Based on these results, a crystal was pulled while doped with nitrogen at a pulling rate within the range of from V1 to V2. Then, this crystal was processed into a mirror surface wafer, and examined for oxide dielectric breakdown voltage. As a result, it showed extremely good oxide dielectric breakdown voltage, and C-mode good chip yield of 100%.

As a result of the above experiments and studies, it was found that the pulling rate V1 at which the OSF ring disappeared (0.54 mm/min) without doping with nitrogen had shifted to the pulling rate V2 (0.75 mm/min) in the higher pulling rate side by the doping with nitrogen. Besides, the region obtained with a pulling rate within a range of from V1 to V2 (V1+0.21 mm/min) according to the present invention was afforded as an extremely low defect region, which contained no small pits. This region otherwise should have been obtained as the V-rich region if the crystal was pulled in a conventional manner. When this crystal was processed into a mirror surface wafer, it showed extremely good oxide dielectric breakdown voltage, and C-mode good chip yield of 100%.

The aforementioned range of the pulling rate, 0.54–0.75 mm/min, can be used only for a particular internal structure the furnace, i.e., one providing the average temperature gradient G [K/mm] of 3.551 K/mm, and it cannot be used regardless of the value of G. Therefore, it was attempted to obtain a range of the pulling rate capable of eliminating defects by using a parameter V/G, which was considered to determine the density of point defects.

That is, the range of the pulling rate was defined by using V/G, based on the results of the aforementioned experiments and studies. Because the aforementioned HZ had a value G of 3.551 K/mm, the value of V/G as a value at which the OSF ring disappeared without doping with nitrogen is calculated as V1/G=0.54/3.551=0.152 mm$^2$/K·min, and the value of V/G as the upper limit for eliminating small pits with doping with nitrogen is calculated as V2/G=0.75/3.551=0.214 mm$^2$/K·min. The difference of these V/G values is 0.062 mm$^2$/K·min, and the difference of the pulling rate can be obtained by multiplying this difference by G (0.062×3.551=0.21 mm/min). Therefore, by using a range of from V1 to V1+0.062×G, the advantage of the present invention can be obtained for any value of temperature gradient G provided by the internal structure of furnace (HZ).

According to the present invention, because it is not necessary to make ΔG smaller like in the case that a crystal is pulled as a crystal composed only of the N-region without doping with nitrogen, the pulling rate can be made further faster by cooling the crystal as rapidly as possible, and using an HZ with a large G. Therefore, by pulling a crystal with a pulling rate within the range of V1 to V1+0.062×G while the crystal is doped with nitrogen, extremely low defect wafers, in particular, with no small pits over the entire wafer plane can be easily produced at a high speed, and thus improvements of yield and productivity as well as cost reduction can be realized.

For the purpose of the present invention, a silicon single crystal ingot in which nitrogen is doped can be grown by the CZ method according to a known method such as disclosed in, for example, Japanese Patent Application Laid-open (KOKAI) No. 60-251190.

Namely, the CZ method comprises contacting a seed crystal with a melt of polycrystal silicon raw material contained in a quartz crucible, and slowly pulling it with rotation to grow a silicon single crystal ingot having an intended diameter, and in such a method nitrogen can be doped in the silicon single crystal during the pulling by previously placing nitride in the quartz crucible, adding nitride into the silicon melt, or using an atmosphere gas containing nitrogen. A doping amount of nitrogen in the crystal can be adjusted by controlling the amount of nitride, concentration or time of introduction of nitrogen gas.

As described above, generation of crystal defects introduced during growth of crystal can be suppressed by doping nitrogen when growing a single crystal ingot by the CZ method.

According to the present invention, the doping amount of nitrogen is preferably $1 \times 10^{14}$ atoms/cm$^3$ or more. It was found that the doping of small amount of nitrogen shifted the defect distribution to the higher pulling rate side, and the doping with nitrogen exerted extremely strong effect in proportion to the doping amount. As for the region containing no small pits according to the present invention, a doping amount of $1 \times 10^{14}$ atoms/cm$^3$ or more could afford potential effect for avoiding the formation of crystal defects, and eliminate small pits.

Thus, silicon single crystal wafers doped with nitrogen and free from small pits in a region covering the entire plane can be stably produced with high productivity.

As for the excessive nitrogen present in the crystal, a wafer obtained from a silicon single crystal doped with nitrogen can be subjected to a heat treatment to out-diffuse nitrogen contained in the wafer surface layer. This can afford a wafer with extremely few crystal defects in the wafer surface layer. On the other hand, because the bulk portion of wafer contains nitrogen, oxygen precipitation is enhanced therein, and hence a wafer with sufficient IG effect (intrinsic gettering effect) can be obtained.

As for specific conditions of the heat treatment to out-diffuse nitrogen in the wafer surface layer, it is preferably performed, for example, at a temperature of 900° C. to the melting point of silicon.

The heat treatment within the aforementioned temperature range can sufficiently out-diffuse nitrogen in the wafer surface layer, and simultaneously out-diffuse oxygen. Therefore, the generation of defects due to oxide precipitates in the surface layer can be substantially completely prevented.

On the other hand, because oxide precipitates can be grown in the bulk portion by the aforementioned heat treatment, a wafer having IG effect can be obtained. In particular, according to the present invention, oxygen precipitation is accelerated by the presence of nitrogen in the bulk portion, high IG effect can be obtained, and sufficient IG effect can be obtained even with a silicon wafer of low oxygen concentration.

The heat treatment is preferably performed in an apparatus for rapid heating and rapid cooling. Such an apparatus is an automatic continuous heat treatment apparatus for single wafer processing, which is so-called RTA apparatus. This apparatus can perform heating and cooling before and after the heat treatment within several seconds to several hundreds of seconds, and therefore it can perform effective heat treatment within a short period of time, i.e., several seconds to several hundreds of seconds without imparting to wafers long thermal history accompanied by various disadvantages.

The heat treatment for out-diffusing nitrogen present in the wafer surface layer is preferably performed in an atmosphere of oxygen, hydrogen, argon or mixtures thereof.

By performing the heat treatment in such a gaseous atmosphere, nitrogen can efficiently be out-diffused without forming a surface film harmful to wafers. In particular, the heat treatment is more preferably performed at a high temperature in a reducing atmosphere of hydrogen, argon or mixtures thereof, because crystal defects in the wafer surface layer are more likely to be eliminated by such a heat treatment.

Thus, there can be obtained an extremely low defect silicon single crystal wafer produced by the CZ method, wherein nitrogen contained in the silicon single crystal wafer surface layer is out-diffused by the heat treatment.

The apparatus for pulling a single crystal and RTA apparatus used for the present invention will be explained hereinafter.

First, an exemplary structure of the apparatus for pulling a single crystal by the CZ method will be explained by referring to FIG. 2. As shown in FIG. 2, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefor (not shown), seed chuck 6 for holding a silicon seed crystal 5, cable 7 for pulling the seed chuck 6, and winding mechanism (not shown) for rotating and winding the cable 7. The crucible 32 is composed of an inner quartz crucible for accommodating a silicon melt (molten metal) 2, and an outer graphite crucible. Further, insulating material 35 surrounds the outside of the heater 34.

A cylindrical cooling apparatus (not shown) for cooling the single crystal by jetting cooling gas, or shielding radiant heat may be provided.

Recently, the so-called MCZ method is frequently used to obtain stable growth of single crystals, in which method a magnet (not shown) is installed outside the pulling chamber 31 in the horizontal direction to apply horizontal or vertical magnetic field to the silicon melt 2 so as to prevent the convection of the silicon melt 2.

Now, the method for growing a single crystal by the aforementioned apparatus 30 for pulling a single crystal will be explained hereinafter.

First, a silicon polycrystal material of high purity is melted in the crucible 32 by heating to a temperature higher than the melting point (about 1420° C.). At this point, for example, a silicon wafer having a nitride film is introduced into the crucible for doping with nitrogen. Then, a tip end of the seed crystal 5 is brought into contact with, or immersed into the surface of the melt 2 at its approximate center portion by reeling out the cable 7. Then, the crucible-holding shaft 33 is rotated in an optional direction, and the seed crystal 5 is simultaneously pulled upwardly by winding up the cable 7 with rotating the cable to start the growing of single crystal. Thereafter, a single crystal ingot 1 doped with nitrogen approximately in a cylindrical shape can be obtained by appropriately controlling the pulling rate and temperature.

Then, the obtained silicon single crystal ingot containing nitrogen is sliced into wafers, which are then subjected to a predetermined wafer processing, and heat treatment for out-diffusing nitrogen contained in the wafer surface layer. According to the present invention, an apparatus capable of rapid heating and rapid cooling, RTA apparatus, may be used for the heat treatment. As the RTA apparatus, those apparatuses utilizing heat radiation such as lamp heater can be mentioned. Commercially available apparatuses such as SHS-2800, AST Co., Ltd. can also be used, and those are not so complicated and expensive.

Figure 3:
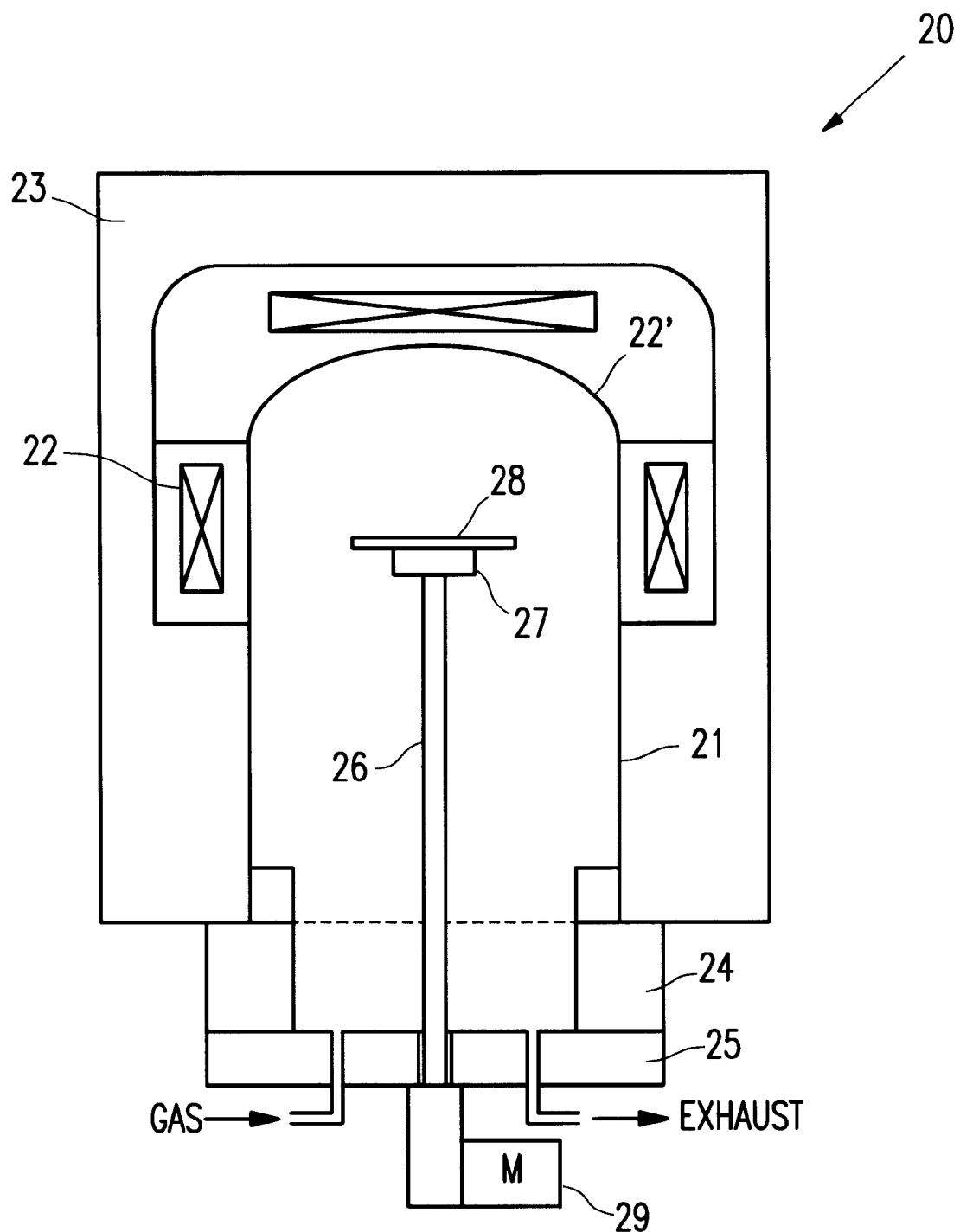
FIG. 3 is a schematic explanatory view of an exemplary rapid thermal annealer used for the present invention.

An exemplary RTA apparatus used for the present invention is shown in FIG. 3.

The heat treatment apparatus 20 shown in FIG. 3 comprises a bell jar 21 composed of, for example, silicon carbide or quartz, and silicon wafers are heat-treated in this bell jar 21. Heating is performed by heaters 22 and 22', which are disposed so that they should surround the bell jar 21. These heaters constitute a top part and a lateral part, and electric power supplied to them can be independently controlled. Of course, the heating mechanism is not limited to this, and the so-called radiant heating, high-frequency heating and the like may also be used. A housing 23 for shielding heat is disposed outside the heaters 22 and 22'.

A water cooled chamber 24 and a base plate 25 are disposed under a furnace, and they shut the inside of the bell jar 21 off from the outer air. A silicon wafer 28 is held on a stage 27, and the stage 27 is fixed at the top of supporting shaft 26, which can be freely moved upward and downward by a motor 29. The water cooled chamber 24 has a wafer insertion port (not shown in the figure) which can be opened and closed by a gate valve, so that the wafer can be put into and taken out from the furnace along the transverse direction. The base plate 25 is provided with a gas inlet and exhaust outlet, so that the gaseous atmosphere in the furnace can be controlled.

By using such a heat treatment apparatus 20 as mentioned above, the heat treatment of a silicon wafer for rapid heating and rapid cooling is performed as follows.

First, the inside of the bell jar 21 is heated to a desired temperature, for example, 900° C. to the melting point of silicon, by the heaters 22 and 22', and maintained at that temperature. By independently controlling the electric power supplied to each of the separate heaters, temperature gradient can be obtained in the bell jar 21 along its height direction. Therefore, the heat treatment temperature can be selected by changing the position of the stage 27, i.e., the length of the supporting shaft 26 inserted into the furnace. As the atmosphere for the heat treatment, oxygen, hydrogen, argon or a mixture thereof is used.

After the inside of the bell jar 21 reached and maintained at the desired temperature, a silicon wafer is inserted from the insertion port of the water cooled chamber 24 by a wafer handling apparatus not shown in the figure, which is disposed at a neighboring position of the heat treatment apparatus 20, and placed on the stage 27 waiting at its lowest position via, for example, a SiC boat. At this point, because the water cooled chamber 24 and the-base plate 25 are cooled with water, the wafer is not heated to a high temperature at that position.

After the silicon wafer is placed on the stage 27, the stage 27 is immediately elevated to a position of desired temperature of from 900° C. to the melting point of silicon by inserting the supporting shaft 26 into the inside of the furnace by the motor 29 so that the wafer on the stage should be subjected to the high temperature heat treatment. In this operation, because the stage moves from its lowest position in the water cooled chamber 24 to the desired temperature position within, for example, only 20 seconds, the wafer will be rapidly heated.

Then, by maintaining the stage 27 at the desired temperature position for a predetermined period of time (several seconds to several hundreds of seconds), the wafer can be subjected to the high temperature heat treatment for the time that the wafer is maintained at the heating position. When the predetermined time has passed and the high temperature heat treatment was finished, the stage 27 is immediately descended by pulling the supporting shaft 26 out from the furnace by the motor 29, and positioned at the bottom of the water cooled chamber 24. This descending operation can also be performed within, for example, about 20 seconds. Because the water cooled chamber 24 and the base plate 25 are cooled with water, the silicon wafer on the stage 27 is cooled rapidly. Finally, the silicon wafer is taken out by the wafer handling apparatus to finish the heat treatment. When additional silicon wafers are to be heat-treated, those silicon wafers can be introduced successively into the apparatus and subjected to the heat treatment, since the temperature in the heat treatment apparatus 20 is not lowered.

The present invention is not limited to the embodiments described above. The above-described embodiments are mere examples, and those having the substantially same structure as that described in the appended claims and providing the similar functions and advantages are included in the scope of the present invention.

For example, while the aforementioned embodiments were explained for the growth of silicon single crystals having a diameter of 6 inches, the present invention is not limited to them, and can be used for a silicon single crystal having a diameter of 8 to 16 inches or more by pulling the crystal at a pulling rate within the range of from V1 to V1+0.062×G, while doping with nitrogen. Of course, the present invention can be used for the so-called MCZ method in which the silicon melt is applied with a horizontal magnetic field, vertical magnetic field, cusped magnetic field or the like.

What is claimed is:

1. A method for producing a silicon single crystal by growing the silicon single crystal by the Czochralski method, wherein the crystal is pulled at a pulling rate [mm/min] within a range of from V1 to V1+0.062×G while the crystal is doped with nitrogen during the growing, where G [K/mm] represents an average temperature gradient along the crystal growing direction, which is for a temperature range of from the melting point of silicon to 1400° C., and provided in an apparatus used for the crystal growing, and V1 [mm/min] represents a pulling rate at which an OSF ring disappears at the center of the crystal when the crystal is pulled by gradually decreasing the pulling rate.

2. The method for producing a silicon single crystal according to claim 1, wherein nitrogen is doped at a concentration of $1 \times 10^{14}$ atoms/cm$^3$ or more.

3. A method for producing a silicon single crystal wafer, which comprises subjecting a wafer obtained from a silicon single crystal produced by a method according to claim 2 to a heat treatment to out-diffuse nitrogen in a surface layer of the wafer.

4. The method for producing a silicon single crystal wafer according to claim 3, wherein the heat treatment is performed by a rapid thermal annealer.

5. A silicon single crystal wafer, which is obtained from a silicon single crystal produced by a method according to claim 2.

6. A method for producing a silicon single crystal wafer, which comprises subjecting a wafer obtained from a silicon single crystal produced by a method according to claim 1 to a heat treatment to out-diffuse nitrogen in a surface layer of the wafer.

7. The method for producing a silicon single crystal wafer according to claim 6, wherein the heat treatment is performed by a rapid thermal annealer.

8. A silicon single crystal wafer, which is obtained from a silicon single crystal produced by a method according to claim 1.

* * * * *